(12) United States Patent
Migliavacca

(10) Patent No.: US 7,733,116 B2
(45) Date of Patent: Jun. 8, 2010

(54) METHOD OF TESTING A POWER SUPPLY CONTROLLER AND STRUCTURE THEREFOR

(75) Inventor: Paolo Migliavacca, Mauzac (FR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 252 days.

(21) Appl. No.: 11/573,076

(22) PCT Filed: Oct. 12, 2004

(86) PCT No.: PCT/US2004/033414

§ 371 (c)(1),
(2), (4) Date: Oct. 3, 2007

(87) PCT Pub. No.: WO2006/043915

PCT Pub. Date: Apr. 27, 2006

(65) Prior Publication Data

US 2008/0094097 A1    Apr. 24, 2008

(51) Int. Cl.
*G01R 31/36* (2006.01)
*G01R 31/26* (2006.01)

(52) U.S. Cl. ............... 324/771; 324/765; 324/158.1; 324/73.1; 323/282; 323/285; 323/299

(58) Field of Classification Search ........... 324/771, 324/73.1, 158.1; 323/282, 285, 299
See application file for complete search history.

(56) References Cited

U.S. PATENT DOCUMENTS

| | | | | |
|---|---|---|---|---|
| 4,169,372 A | * | 10/1979 | Colwill et al. | 73/862.18 |
| 6,586,958 B2 | * | 7/2003 | Sudo et al. | 324/765 |
| 2007/0296454 A1 | * | 12/2007 | Koura | 324/771 |

* cited by examiner

*Primary Examiner*—Ha Tran T Nguyen
*Assistant Examiner*—Emily Y Chan
(74) *Attorney, Agent, or Firm*—Robert F. Hightower

(57) ABSTRACT

A power supply controller (20) is configured to operate in a test mode that facilitates measuring the value of an output signal of an error amplifier (36) of the power supply controller (20).

8 Claims, 2 Drawing Sheets

US 7,733,116 B2

METHOD OF TESTING A POWER SUPPLY CONTROLLER AND STRUCTURE THEREFOR

BACKGROUND OF THE INVENTION

The present invention relates, in general, to electronics, and more particularly, to methods of forming semiconductor devices and structure.

In the past, the semiconductor industry utilized various methods and structures to build pulse width modulated (PWM) power supply controllers. However, it was often difficult to accurately test the accuracy of the control loop of the power supply controller. Typically, test probes were placed in contact with various points on the power controller semiconductor die and were used to inject signals and sample signals at different points on the semiconductor die. However, these probes had very large parasitic capacitance and inductance. When the power supply controller was tested, the parasitic capacitance and inductance resulted in large noise signals that made it difficult to accurately determine the value of the signals under test. In some cases, the circuit was operated at very low speed in order to reduce some of the noise. However, these lower speeds increased testing time thereby increasing the cost of the power supply controllers.

Accordingly, it is desirable to have a method of testing a power supply controller that accurately determines the value of the signals under test, that does not increase the test time, and that reduces the cost of the power supply controller.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention.

DETAILED DESCRIPTION OF THE DRAWINGS

Figure 1:
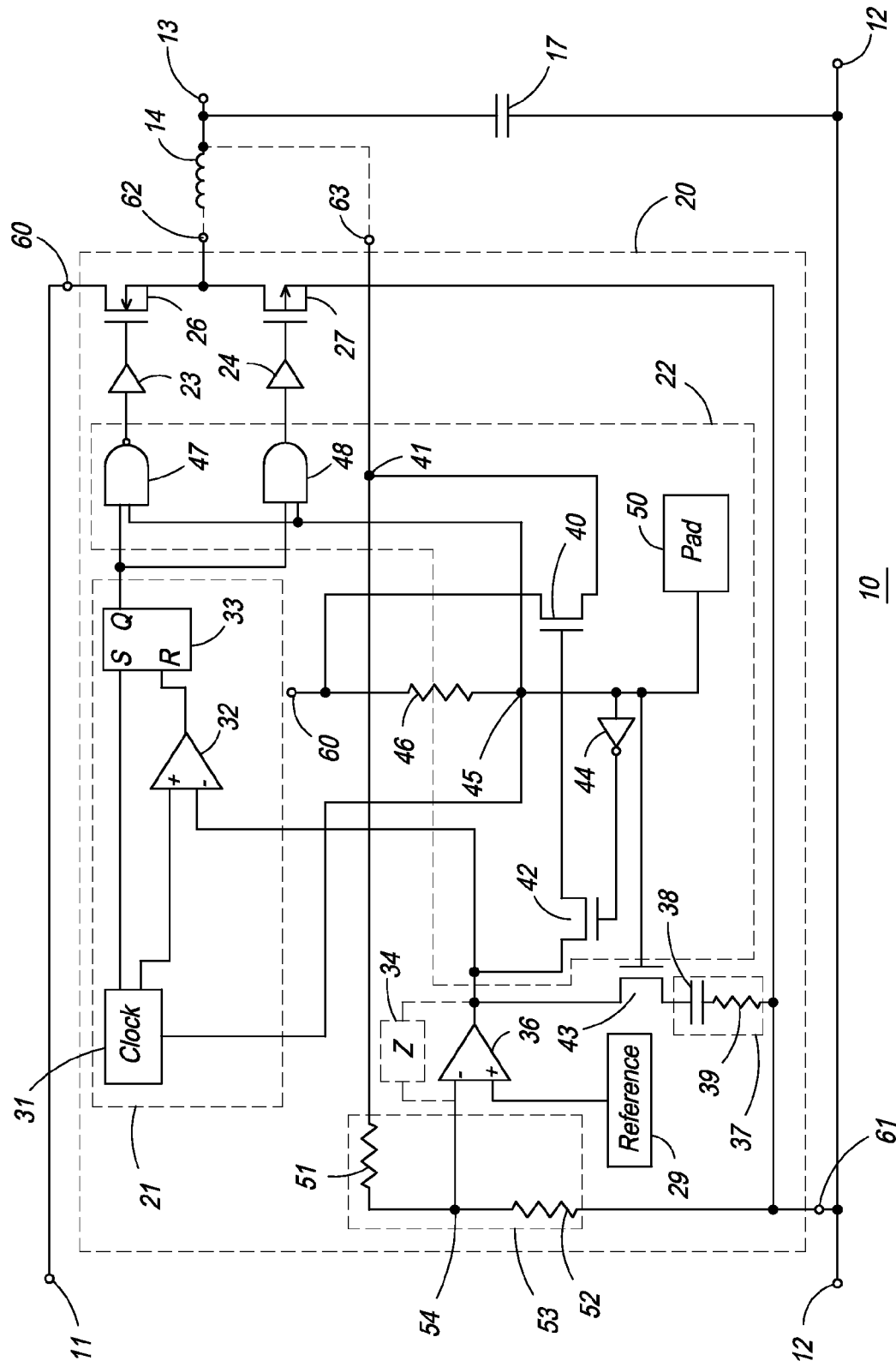
FIG. 1 schematically illustrates an embodiment of a portion of a power supply system that includes a power supply controller in accordance with the present invention.

FIG. 1 schematically illustrates an embodiment of a portion of a power supply system 10 that includes a power supply controller 20. System 10 receives power between a power input terminal 11 and a common return terminal 12 and responsively supplies an output voltage between a voltage output 13 and terminal 12. The voltage applied between terminals 11 and 12 typically is a battery or other dc voltage. System 10 also includes an energy storage inductor 14 that is coupled between output 13 and an output terminal 62 of controller 20, and an energy storage capacitor 17 that is coupled between output 13 and terminal 12.

Controller 20 receives power from terminal 11 between a voltage input terminal 60 that is connected to terminal 11 and a voltage return 61 that is connected to terminal 12. Controller 20 typically includes a pulse width modulated (PWM) controller 21, a first power switch or upper power switch 26, a first power switch or upper power switch driver 23, a second power switch or lower power switch 27, a second power switch driver or lower power switch driver 24, an error amplifier 36, a voltage reference generator or reference 29, a feedback circuit 53, and a test mode controller 22. Typically, the voltage applied to terminal 11 is suitable for operating controller 20. If the voltage from terminal 11 is not suitable for operating controller 20, controller 20 may also include an internal regulator. In the preferred embodiment, switch 26 is a P-channel power MOS transistor and switch 27 is an N-channel power MOS transistor. In other embodiments switches 26 and 27 may have other configurations such as a PNP and an NPN bipolar transistor, respectively. PWM controller 21 includes a clock generator or clock 31, a PWM comparator 32, and a PWM latch 33. Clock 31 generates a free running clock signal on a first output of clock 31 that is used to set latch 33. Clock 31 also generates a ramp signal on a second output that is received by comparator 32 and assists in resetting or clearing latch 33. Such PWM controllers are well known to those skilled in the art. Additionally, the free running clock and the ramp signal generated by clock 31 may be stopped and reset to a low output value by negating an enable signal that is applied to an enable input of clock 31. When the reset signal is negated or low clock 31 is reset, and when the enable signal goes high or is asserted clock 31 starts another clock cycle and the corresponding ramp signal. Those skilled in the art recognize that PWM controller 21 may also include other circuits and functions such as current mode control or ramp compensation that is not shown in FIG. 1. Reference 29 forms a reference voltage on an output of reference 29. The reference voltage is used to assist in regulating the value of the output voltage. Controller 22 is configured to control switching or alternating controller 20 between a normal operating mode in which controller 20 drives inductor 14 and regulates the output voltage on output 13 and a test mode which is used for testing the control loop of controller 20.

Controller 22 includes a first switch or test mode switch or test mode transistor 42, an impedance translator 40, an inverter 44, and a probe pad 50. Probe pad 50 is formed to allow a test probe or other similar device to contact pad 50 and to inject an external signal that switches controller 22 to operate controller 20 in either the test mode or the normal mode. When the external signal is not applied to pad 50, a resistor 46 applies a high voltage to pad 50, a mode node 45, and the elements connected thereto. When a test probe is in contact with pad 50, the test probe can inject the external signal that forces pad 50 and the elements connected thereto to either a low voltage or a high voltage. The low voltage typically is substantially equal to the voltage on return 61 and the high voltage is sufficient to at least trigger inverter 44. The low voltage places controller 22 in the test mode of operation and the high voltage places controller 22 in the normal mode of operation.

Controller 20 also may include an optional transistor 43 and an alternate frequency compensation network 34. Network 34 may be coupled between the inverting input and the output of amplifier 36 in order to provide compensation for the poles and zeroes of the closed loop that is used to regulate the output voltage during the normal mode of operation of system 10. Such frequency compensations networks are well known to those skilled in the art. Optional transistor 43 may be used to decouple network 37 from the output of amplifier 36 during the test mode of operation.

In a typical system configuration, no signal is injected into pad 50 and controller 20 operates in the normal mode. In such a configuration, output terminal 62 typically is connected to inductor 14 and a sense input terminal 63 of controller 20 is connected to output 13 to receive the output voltage. In the normal mode, feedback circuit 53 receives the output voltage and forms a feedback signal on a feedback node 54 that is representative of the output voltage. In the preferred embodiment, circuit 53 is a voltage divider that includes a first voltage divider resistor 51 and a second voltage divider resistor 52. Circuit 53 may have other configurations in other embodiments. The feedback signal from node 54 and the reference voltage from reference 29 are received by amplifier 36 which responsively forms an error signal as the amplifier output signal on an output of amplifier 36. Such error signals are well known to those skilled in the art. In most embodiments, amplifier 36 is a transconductance amplifier that has a high output impedance. The output impedance typically is greater than about one million (1 M) ohms and preferably is greater than about ten million (10 M) ohms. Additionally, in most embodiments amplifier 36 has a frequency compensation network 37 connected to the output of amplifier 36 in order to provide a stable control loop for controller 20 and to improve the stability of the output voltage. In the preferred embodiment, frequency compensation network 37 includes series connected capacitor 38 and resistor 39 that are connected from the output of amplifier 36 to return 61. In other embodiments, network 37 may have other configurations. Since no external signal is applied to pad 50, resistor 46 applies the high voltage to node 45. The high voltage on node 45 enables clock 31 to generate the free running clock signal and the corresponding ramp signal. For the case where alternate transistor 43 is used, the high on node 45 also enables transistor 43 to couple network 37 to the output of amplifier 36. Amplifier 36 receives the feedback signal and the reference voltage and responsively forms the error signal. The high on node 45 also drives the output of inverter 44 low to disable transistor 42. Disabling transistor 42 ensures that transistor 40 does not interfere with the amplified error signal. PWM controller 21 receives the error signal and responsively generates a PWM control signal on a Q output of latch 33. The high voltage on node 45 also enables gates 47 and 48 to receive the PWM control signal from controller 21 and responsively generate a pair of PWM control signals that are applied to drivers 23 and 24. Drivers 23 and 24 receive the PWM control signals and responsively generate PWM drive signals to drive switches 26 and 27. Switches 26 and 27 responsively drive inductor 14 to regulate the value of the output voltage on output 13. Thus, the high on pad 50 and node 45 enables PWM controller 21 to form the PWM control signal and enables controller 20 to generate PWM control signals and corresponding PWM drive signals.

When the low voltage is applied to pad 50, for example externally injected into controller 22 at pad 50 by a test probe, node 45 is forced to the low voltage. The low voltage switches controller 20 to operate in the test mode. In most embodiments that controller 20 is operated in the test mode, terminal 62 is not connected to inductor 14 and terminal 63 is not connected to output 13 as illustrated by the dashed lines. Typically the connections to terminals 62 and 63 not formed, however, in some embodiments control switches may be used to disconnect terminals 62 and 63. The low voltage on pad 50 and node 45 disables transistor 43 and decouples network 37 from the output of amplifier 36. The low on node 45 also disables clock 31 and resets the clock and ramp signals to a low value that is approximately equal to the voltage on return 61. Disabling or stopping clock 31 and the corresponding clock signal reduces noise that may be coupled into the output of amplifier 36. The low at node 45 also disables gates 47 and 48 thereby preventing the output of latch 33 from driving drivers 23 and 24. The low from node 45 drives the output of gate 47 high and the output of gate 48 low which disables respective switches 26 and 27 thereby inhibiting controller 20 from driving inductor 14 and disabling controller 20 from regulating the output voltage. Thus, forcing node 45 low inhibits controller 20 from generating PWM drive signals on the outputs of drivers 23 and 24. The low voltage at node 45 also drives the output of inverter 44 high enabling transistor 42.

Enabling transistor 42 couples the output signal from the output of amplifier 36 to the input of translator 40. Translator 40 functions as a voltage follower and couples the value of the output signal minus the gate-source voltage (Vgs) of translator 40 to node 41, sense input terminal 63, and to the input of amplifier 36 through feedback circuit 53. The output signal on the output of translator 40 at a node 41 during the time that transistor 42 is enabled in the test mode is referred to hereinafter as a loop test signal. Since translator 40 is coupled in the voltage follower configuration, translator 40 has a low output impedance so that any parasitic capacitance or inductance that is connected to input terminal 63 or to node 41, such as from test probes or test fixtures, does not inject noise into the loop test signal thereby facilitating accurately measuring the value of the loop test signal. The closed loop output impedance of translator 40 in the test mode typically is no greater than about one hundred (100) ohms and preferably is less than about one (1) ohm. In the preferred embodiment, translator 40 is an N-channel MOS transistor. In other embodiments translator 40 may have other embodiments as long as the output impedance is low and the voltage differential between the output signal of amplifier 36 and the loop test signal is very predictable. For example, translator 40 may be a follower amplifier with a low offset voltage. Since the output of amplifier 36 is coupled to sense input terminal 63 through transistor 42 and translator 40, the value of the loop test signal can be measured by applying a probe to node 41 or to terminal 63.

In the test mode, the output signal of amplifier 36 is coupled through transistor 42, translator 40, node 41, and circuit 53 back to amplifier 36. Amplifier 36 has a high gain, typically greater than about sixty decibels (60 db). In equilibrium the loop test signal on node 41 is a function of the value of the reference voltage and the offset voltage of amplifier 36 as shown by the following equation:

$$V41 = V36 - Vgs(40)$$
$$= A * (Voffset + Vref - (V41 * (R52/(R52 + R51)))) - Vgs(40)$$
$$= (A * (Voffset + Vref) - Vgs(40))/(1 + A * (R52/(R52 + R51)))$$

For $A \gg 1$, $V41$ becomes $$V41 = (Voffset + Vref) * (R52 + R51)/R52$$

where:
V36—Output voltage of amplifier 36,
V41—Voltage at node 41,
Vgs(40)—the gate-source voltage of transistor 40
Voffset—the offset voltage of amplifier 36,
Vref—the value of the reference voltage,
R51—the value of resistor 51, and
R52—the value of resistor 52.

As shown by the equations, since the reference voltage and the offset are amplified through amplifier 36 the value of the loop test signal includes the value of the offset voltages of amplifier 36. For example, amplifier 36 may have an input offset voltage that is about five to ten (5-10) milli-volts. This voltage is added to the value of the reference voltage and then amplified by amplifier 36 along with the value of the reference voltage in the manner shown by the equations. Additionally, since the output signal of translator 40 is coupled through circuit 53 to the input of amplifier 36, the loop test signal includes any errors in the value of the elements of circuit 53. In the normal operating mode, such offset voltages and errors would detrimentally affect the operation of the control loop of controller 20 and system 10. Therefore, it is desirable to measure the offset voltages and to minimize the effect on the operation of system 10.

As part of the test procedure, the value of the reference voltage from reference 29 is measured and reference 29 is trimmed or adjusted until the value of the reference voltage is substantially equal to the desired value. This allows a guarantee of a quasi-invariant output voltage with temperature. After reference 29 is trimmed to the desired values, controller 20 is operated in the test mode and the value of the loop test signal is measured. Since the reference voltage has been substantially corrected, the deviation of the loop test signal from the desired value is primarily due to the input offset voltage of amplifier 36 and the mismatch of resistors 51 and 52 as shown in the hereinbefore equations. Thus, resistors 51 and 52 are trimmed or adjusted until the value of V41 is substantially equal to the desired or expected value. In some cases, resistors 51 and 52 may be external to controller 20. For such cases, amplifier 36 may be trimmed until the value of the voltage V41 is substantially equal to the desired or expected value. As is well known in the art there are always minor variances that prevent the measured values from being identically equal to the desired or expected values. It is well established in the art that variances of up to about ten percent (10%) are regarded as reasonable variances from the ideal goal of exactly equal. Methods for trimming the reference voltage of reference 29, the values of resistors 51 and 52, and the offset voltage of amplifier 36 are well known to those skilled in the art. Thus, after controller 20 is adjusted in the test mode, the value of the loop test signal on node 41 is substantially equal to the value of the reference voltage multiplied by the ideal ratio of (R52+R51)/R52. After the test procedure is complete and when controller 20 is operated in the normal mode, controller 20 forms an output voltage that is accurate over the desired operating temperature range of controller 20.

In order to provide the functionality described for controller 20, regulator 28 is connected between input terminal 60 and return 61. A first terminal of resistor 51 is connected to both node 41 and terminal 63 and a second terminal of resistor 51 is commonly connected to node 54, the inverting input of amplifier 36, and to a first terminal of resistor 52. Second terminal of resistor 52 is connected to return 61. A non-inverting input of amplifier 36 is connected to the output of reference 29. The output of amplifier 36 is commonly connected to a source of transistor 42, to the inverting input of comparator 32, and to a first terminal of capacitor 38. A second terminal of capacitor 38 is connected to a first terminal of resistor 39 which has a second terminal connected to return 61. A gate of transistor 42 is connected to an output of inverter 44 and a drain of transistor 42 is connected to a gate of transistor 40. An input of inverter 44 is commonly connected to node 45 the enable input of clock 31, a first terminal of resistor 46, to pad 50, and to a first input of gates 47 and 48.

A second terminal of resistor 46 is commonly connected to terminal 60 and to a drain of translator 40. A source of transistor 40 is connected to node 41 and to terminal 63. A first output of clock 31 is connected to the set input of latch 33. Second output of clock 31 is connected to the non-inverting input of comparator 32 which has an output connected to the reset input of latch 33. A Q output of latch 33 is connected to a second input of gates 47 and 48. An output of gate 47 is connected to an input of driver 23 which has an output connected to the gate of transistor switch 26. An output of gate 48 is connected to an input of driver 24 which has an output connected to the gate of transistor switch 27. A source of transistor switch 26 is connected input terminal 60 and a drain of transistor switch 26 is commonly connected to a drain of transistor switch 27 and to output terminal 62. A source of transistor switch 27 is connected to return 61.

Figure 2:
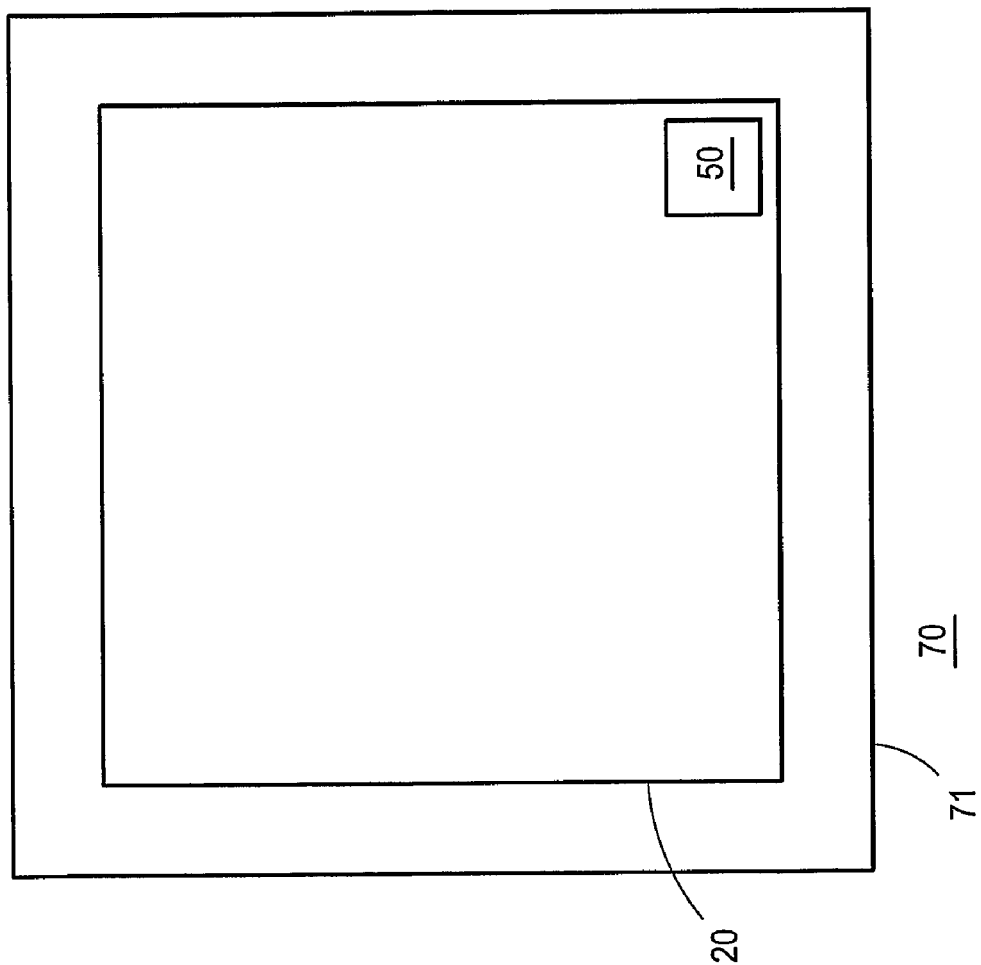
FIG. 2 schematically illustrates an enlarged plan view of an embodiment of a portion of a semiconductor device that includes the power supply controller of FIG. 1 in accordance with the present invention.

FIG. 2 schematically illustrates an enlarged plan view of a portion of an embodiment of a semiconductor device 70 that is formed on a semiconductor die 71. Controller 20 is formed on die 71. Pad 50 is positioned in an area of die 71 that provides easy access for a test probe. Die 71 may also include other circuits that are not shown in FIG. 2 for simplicity of the drawing. Controller 20 and device 70 are formed on die 71 by semiconductor manufacturing techniques that are well known to those skilled in the art.

It should be noted that in some embodiments, any of drivers 23 and 24, switches 26 and 27, and circuit 53 may be external to controller 20. For the embodiment with drivers 23 and 24 external to controller 20, gates 47 and 48 may also be external to controller 20. Additionally, the output of translator 40 may be connected to terminal 62 instead of terminal 63 and terminals 62 and 63 may be connected together externally to controller 20. In some embodiments, circuit 53 may be external to controller 20. For such an implementation, resistors 51 and 52 should be connected to terminal 63. Additionally, the value of resistors 51 and 52 would be adjusted externally to controller 20.

In view of all of the above, it is evident that a novel device and method is disclosed. Coupling the output signal from an error amplifier of a PWM controller through an impedance translator facilitates testing the value of the reference voltage and the offset voltages of the error amplifier. The method also facilitates adjusting the PWM controller to compensate for the offset voltage of the error amplifier and the mismatch of the output resistor bridge.

While the invention is described with specific preferred embodiments, it is evident that many alternatives and variations will be apparent to those skilled in the semiconductor arts. For example, the loop test signal may be accessed by applying a test probe to the output of translator 40 instead of coupling the output of translator 40 to terminal 63. Also, instead of stopping the clock in the test mode, the output of amplifier 36 may be switched off to comparator 32 and the input to comparator 32 may be switched to ground. Although controller 20 is illustrated as used in a buck inductive dc-dc converter, the test method and structure is generally applicable other dc-dc converters including boost inductive systems and capacitive charge pump systems. The word "connected" is used throughout for clarity of the description, however, it is intended to have the same meaning as the word "coupled". Accordingly, "connected" should be interpreted as including either a direct connection or an indirect connection.

The invention claimed is:

1. A method of forming a power supply controller comprising:

configuring the power supply controller for operation in a test mode for testing a control loop of the power supply controller and a normal mode for regulating a value of output voltage;

configuring the power supply controller to receive a feedback signal that is representative of the output voltage on a first input of an error amplifier and responsively form an output signal on an output of the error amplifier during the normal mode; and configuring the power supply controller to operably couple a first signal that is representative of the output signal of the error amplifier to an input of the error amplifier during the test mode wherein the feedback signal is not coupled to the first input of the error amplifier.

2. The method of claim 1 further including configuring the power supply controller to receive a test mode signal and responsively operate in the test mode.

3. The method of claim 2 further including configuring the power supply controller to receive the test mode signal from a test pad internal to the power supply controller.

4. The method of claim 1 further including configuring the power supply controller to couple the output signal of the error amplifier to a terminal of the power supply controller.

5. The method of claim 1 further including measuring a value of the first signal.

6. The method of claim 5 further including adjusting a value of the first signal and again measuring the value of the first signal.

7. The method of claim 1 further including configuring the power supply controller to inhibit generating PWM drive signals during at least a portion of the test mode.

8. A method of forming a power supply controller comprising:

configuring the power supply controller for operation in a test mode and a normal mode for regulating a value of output voltage wherein the power supply controller generates PWM drive signals to regulate the value of the output voltage;

configuring the power supply controller to receive a feedback signal that is representative of the output voltage on a first input of an error amplifier and responsively form an output signal on an output of the error amplifier during the normal mode;

configuring the power supply controller to operably couple a first signal that is representative of the output signal of the error amplifier to an input of the error amplifier during the test mode including configuring the power supply controller to couple the output signal of the error amplifier to an input of an impedance translator and to couple an output signal of the impedance translator to the input of the error amplifier and to not couple the output signal of the error amplifier through the impedance translator to the input of the error amplifier in the normal mode.

* * * * *